United States Patent
Tsuboi et al.

(10) Patent No.: US 9,510,482 B2
(45) Date of Patent: Nov. 29, 2016

(54) WIRE HARNESS FIXING STRUCTURE

(71) Applicants: TOYOTA JIDOSHA KABUSHIKI KAISHA, Toyota-shi, Aichi-ken (JP); AISIN AW CO., LTD., Anjo-shi, Aichi-ken (JP)

(72) Inventors: Hiroki Tsuboi, Toyota (JP); Taketo Takeuchi, Anjo (JP); Takafumi Ogisu, Anjo (JP)

(73) Assignees: TOYOTA JIDOSHA KABUSHIKI KAISHA, Toyota-shi, Aichi-ken (JP); AISIN AW CO., LTD., Anjo-shi, Aichi-ken (JP)

( * ) Notice: Subject to any disclaimer, the term of this patent is extended or adjusted under 35 U.S.C. 154(b) by 0 days.

(21) Appl. No.: 14/832,318

(22) Filed: Aug. 21, 2015

(65) Prior Publication Data

US 2016/0066473 A1    Mar. 3, 2016

(30) Foreign Application Priority Data

Aug. 27, 2014    (JP) ................................ 2014-172254

(51) Int. Cl.
| | |
|---|---|
| *H05K 7/20* | (2006.01) |
| *H01B 7/00* | (2006.01) |
| *B60R 16/02* | (2006.01) |
| *H02G 3/32* | (2006.01) |

(52) U.S. Cl.
CPC ....... *H05K 7/20281* (2013.01); *B60R 16/0215* (2013.01); *H01B 7/0045* (2013.01); *H02G 3/32* (2013.01)

(58) Field of Classification Search
CPC ............ H05K 7/20281; H01B 7/0045; B60R 16/0215; H02G 3/32; H02G 3/04
USPC ......................................................... 174/72 A
See application file for complete search history.

(56) References Cited

U.S. PATENT DOCUMENTS

| | | | | |
|---|---|---|---|---|
| 4,360,241 A | * | 11/1982 | Fukunaga | .............. B60K 37/00 296/70 |
| 2008/0026601 A1 | | 1/2008 | Thai | |
| 2008/0290234 A1 | * | 11/2008 | Cho | ........................ D06F 9/008 248/231.9 |
| 2012/0138333 A1 | * | 6/2012 | Strahm, Jr. | ............ H01R 13/56 174/135 |

FOREIGN PATENT DOCUMENTS

| | | |
|---|---|---|
| FR | 2883423 A1 | 9/2006 |
| GB | 2051712 A | 1/1981 |
| JP | 2007-244025 A | 9/2007 |
| JP | 2010-081742 A | 4/2010 |
| KR | 10-1998-0030243 A | 7/1998 |
| KR | 20-1998-0042377 U | 9/1998 |
| KR | 20-0397087 Y1 | 9/2005 |
| WO | 2006126799 A2 | 11/2006 |

OTHER PUBLICATIONS

Partial Translation of Kr Office Action issued Sep. 1, 2016 in KR10-2015-0118169.

* cited by examiner

*Primary Examiner* — Timothy Thompson
*Assistant Examiner* — Amol Patel
(74) *Attorney, Agent, or Firm* — Sughrue Mion, PLLC

(57) ABSTRACT

A wire harness fixing structure includes a cooling medium tank provided with a cooling medium relief valve; a sensor that is installed in the cooling medium tank; a connection terminal that is located beyond the cooling medium relief valve as viewed from a position where the sensor is installed; a wire harness that electrically connects the sensor to the connection terminal; and a bracket that is fastened to the cooling medium tank and that fixes the wire harness. The bracket includes a fastened portion that is fastened to the cooling medium tank, and a retention portion that has a substantially U-shaped form closed at a side facing the cooling medium relief valve and that retains the wire harness in the U-shaped form.

6 Claims, 5 Drawing Sheets

WIRE HARNESS FIXING STRUCTURE

INCORPORATION BY REFERENCE

The disclosure of Japanese Patent Application No. 2014-172254 filed on Aug. 27, 2014 including the specification, drawings and abstract is incorporated herein by reference in its entirety.

BACKGROUND OF THE INVENTION

1. Field of the Invention

The invention relates to a wire harness fixing structure in which a wire harness is fixed, the wire harness electrically connecting a sensor that is installed in a cooling medium tank provided with a cooling medium relief valve, to a connection terminal that is located beyond the cooling medium relief valve as viewed from a position where the sensor is installed.

2. Description of Related Art

Conventionally, in order to cool an object such as a rotating electrical machine, there has been known a cooling structure in which a cooling medium is stored in a tank, and a cooling medium relief valve that is provided in the cooling medium tank is opened to inject the cooling medium onto the object. In the cooling structure, various sensors may be installed in the cooling medium tank in order to monitor the temperature, the remaining amount, the viscosity and the like of the cooling medium in the cooling medium tank. A wire harness for transmitting/receiving electric signals is attached to one end of each of the sensors. The other end of the wire harness is connected to a connection terminal such as an electric circuit.

The sensor and the connection terminal may be located on respective sides of the cooling medium relief valve due to various restrictions on design. In the case of this arrangement, the wire harness may extend in the immediate vicinity of or directly above the cooling medium relief valve when the wire harness bends or undulates to a certain extent. When the wire harness extends in the immediate vicinity of or directly above the cooling medium relief valve, the cooling medium injected from the cooling medium relief valve may directly hit the wire harness. As a result, the flow of the injected cooling medium may be hindered, and the wire harness may be damaged.

Conventionally, some brackets that regulate the wiring route for such a wire harness have been proposed. For example, Japanese Patent Application Publication No. 2007-244025 (JP 2007-244025 A) discloses a technology in which a terminal block of a stator is provided with a connection wire guide that presses down a lead wire extending from a thermistor and that retains the lead wire at a position spaced apart from a stator terminal of a rotating electrical machine, in order to restrain the lead wire of the thermistor from interfering with the stator terminal. However, according to the Japanese Patent Application Publication No. 2007-244025 (JP 2007-244025 A), only the regulation of the wiring route for the lead wire in the vicinity of the terminal block is taken into account, and the wiring route in the vicinity of the cooling medium relief valve is not taken into account.

Further, it has been proposed to attach a sensor 12 to a cooling medium tank through the use of a bracket 50 as shown in FIG. 5, and to regulate the route of a wire harness 10 in the vicinity of a cooling medium relief valve. However, as shown in FIG. 5, the bracket 50 in the related art simply presses down the wire harness 10 from above, and thus, the wire harness 10 cannot be sufficiently prevented from moving toward the cooling medium relief valve.

SUMMARY OF THE INVENTION

The invention provides a wire harness fixing structure in which a cooling medium injected from a cooling medium relief valve and a wire harness are more reliably prevented from interfering with each other.

An aspect of the invention relates to a wire harness fixing structure including a cooling medium tank provided with a cooling medium relief valve; a sensor that is installed in the cooling medium tank; a connection terminal that is located beyond the cooling medium relief valve as viewed from a position where the sensor is installed; a wire harness that electrically connects the sensor to the connection terminal; and a bracket that is fastened to the cooling medium tank and that fixes the wire harness. The bracket includes a fastened portion that is fastened to the cooling medium tank, and a retention portion that has a substantially U-shaped form closed at a side facing the cooling medium relief valve and that retains the wire harness in the U-shaped form.

The retention portion may have the substantially U-shaped form that is open at a side opposite to the side facing the cooling medium relief valve. The retention portion may retain the wire harness at a location in a wiring route for the wire harness, the location being in vicinity of the cooling medium relief valve.

The fastened portion of the bracket may have an engagement portion that engages with a portion of the sensor. In this case, the engagement portion may be a slit that is formed in the fastened portion, and the portion of the sensor may enter the slit; and the slit may be open at a side opposite to an opening of the substantially U-shaped form of the retention portion.

The bracket may further include a connecting portion that extends upward from an edge of the fastened portion to a point, and that extends diagonally upward from the point such that the connecting portion connects the fastened portion to the retention portion; and the fastened portion, the connecting portion, and the retention portion may be formed of a single plate material that is bent.

According to the aforementioned aspect of the invention, the wire harness is retained by the retention portion that has the substantially U-shaped form closed at the side facing the cooling medium relief valve. Therefore, the wire harness is effectively prevented from moving toward the cooling medium relief valve. As a result, the cooling medium injected from the cooling medium relief valve and the wire harness can be more reliably prevented from interfering with each other.

BRIEF DESCRIPTION OF THE DRAWINGS

Features, advantages, and technical and industrial significance of an exemplary embodiment of the invention will be described below with reference to the accompanying drawings, in which like numerals denote like elements, and wherein.

DETAILED DESCRIPTION OF EMBODIMENT

Figure 1:
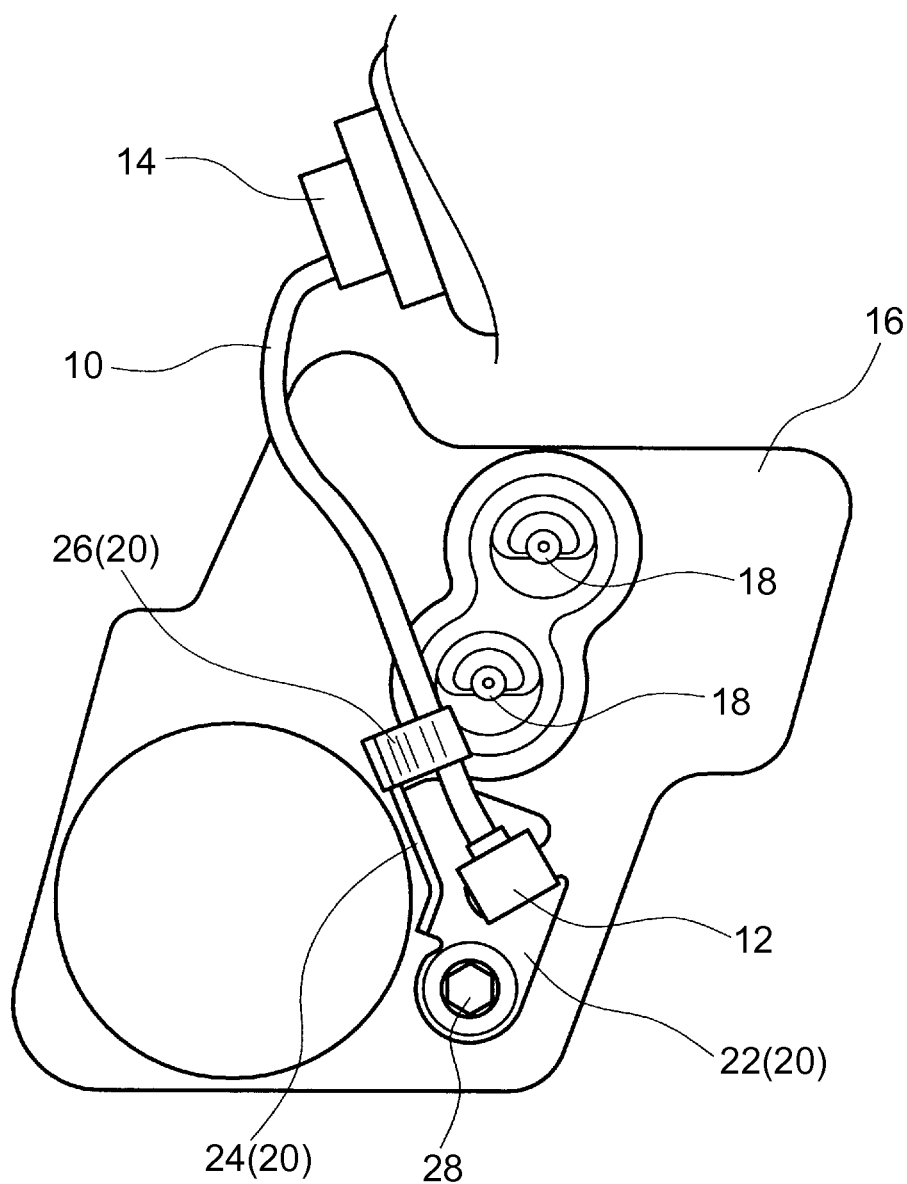
FIG. 1 is a schematic plan view of a cooling medium tank to which a wire harness fixing structure according to an embodiment of the invention is applied, and an area around the cooling medium tank.
Figure 2:
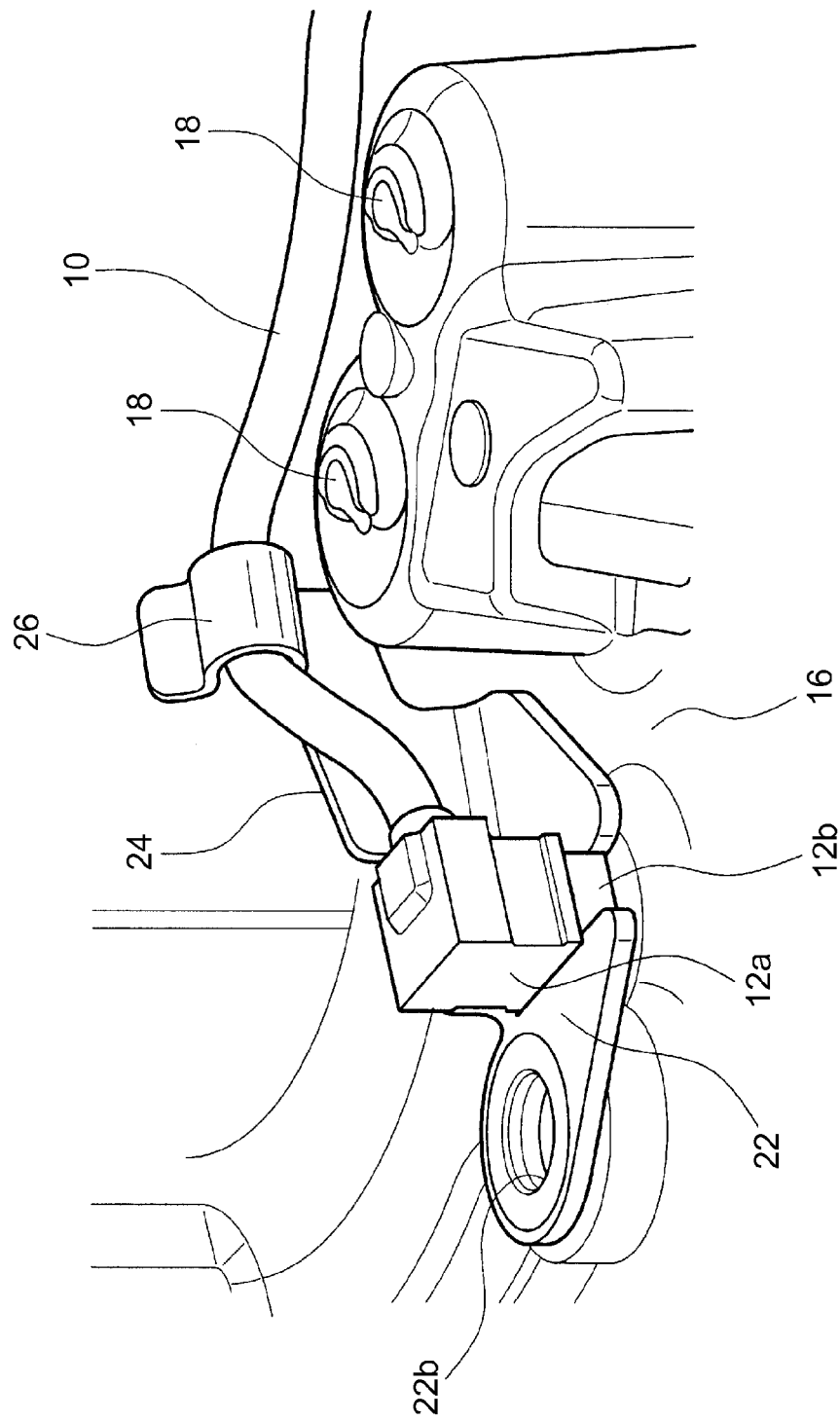
FIG. 2 is a perspective view of the cooling medium tank and the area around the cooling medium tank.

Embodiment of the invention will be described hereinafter with reference to the drawings. FIG. 1 is a schematic plan view of a cooling medium tank 16 to which a wire harness fixing structure according to an embodiment of the invention is applied, and an area around the cooling medium tank 16. FIG. 2 is a perspective view of the cooling medium tank 16 and the area around the cooling medium tank 16. Some members are not shown in FIG. 1 for the sake of understandability.

This cooling medium tank 16 stores a cooling medium for cooling a rotating electrical machine that serves as a power source of a hybrid vehicle or an electric vehicle. The cooling medium may be liquid or gas as long as the rotating electrical machine can be thereby cooled. In the present embodiment of the invention, however, cooling oil is adopted as the cooling medium. This cooling medium tank 16 is accommodated in a motor-generator case together with the rotating electrical machine. Cooling medium relief valves 18 that are opened to inject the cooling medium are appropriately provided on a surface of the cooling medium tank 16. The configuration and number of the cooling medium relief valves 18 are not limited in particular. In the present embodiment of the invention, however, two substantially cylindrical protrusion portions that are adjacent to each other are formed, and the cooling medium relief valves 18 are provided on distal end faces of the protrusion portions respectively. Accordingly, the cooling medium relief valves 18 are installed at a position higher than an installation plane on which a temperature sensor 12 (that will be described later) is installed. A hybrid ECU (not shown) controls the opening/closing of the cooling medium relief valves 18.

The temperature sensor 12, which detects a temperature of the cooling medium in the cooling medium tank 16, is installed at a position that is slightly away from the cooling medium relief valves 18. The temperature sensor 12 includes a substantially box-shaped body portion 12a, a rod-shaped detection element (not shown), and an intermediate portion 12b that is interposed between the body portion 12a and the detection element. An insertion hole through which this detection element is inserted is formed in the surface of the cooling medium tank 16. The detection element can come into contact with the cooling medium in the cooling medium tank 16.

The intermediate portion 12b is larger in diameter than the insertion hole and is smaller in diameter than the body portion 12a. This intermediate portion 12b can enter an engagement slit 22a of a bracket 20 that will be described later, in a sliding manner. The body portion 12a is a substantially box-shaped member. A circuit that transmits/receives electric signals to/from the hybrid ECU is provided in the body portion 12a.

The wire harness 10, which is provided to transmit electric signals, extends from an end face of the body portion 12a. That is, one end of the wire harness 10 is connected to the body portion 12a. The wire harness 10 is obtained by covering a signal wire made of metal with a covering body made of resin or the like. The wire harness 10 has appropriate flexibility, and can be freely bent. The other end of the wire harness 10 is connected to a connection terminal 14 that is provided outside the cooling medium tank 16. The temperature sensor 12 is electrically connected to the hybrid ECU via this wire harness 10 and the connection terminal 14.

The connection terminal 14 is located beyond the cooling medium relief valves as viewed from the temperature sensor 12, as is apparent from FIG. 1. In other words, the temperature sensor 12 is located on one side of the cooling medium relief valves 18, and the connection terminal 14 is located on the other side of the cooling medium relief valves 18. In this case, if the wire harness 10 extending from the temperature sensor 12 is extended toward the connection terminal 14, the wire harness 10 may be located in the immediate vicinity of or directly above the cooling medium relief valves 18. When the wire harness 10 is located in the immediate vicinity of or directly above the cooling medium relief valves 18, the cooling medium injected from the cooling medium relief valves 18 may directly hit the wire harness 10. When the cooling medium directly hits the wire harness 10, the flow of the cooling medium is hindered, so the rotating electrical machine cannot be efficiently cooled. In addition, the wire harness 10 may be damaged due to an impact that is caused when the cooling medium hits the wire harness 10.

Thus, it is desired that the wire harness 10 should extend through a wiring route that is spaced apart from the cooling medium relief valves by a certain distance or more, while laterally bypassing the cooling medium relief valves 18. However, by simply pulling and placing the wire harness 10, the wire harness 10 does not always extend through the desired wiring route. Thus, in the present embodiment of the invention, there is provided a wire harness fixing structure in which the wire harness 10 is fixed such that the wire harness 10 extends through the desired wiring route.

Figure 3B:
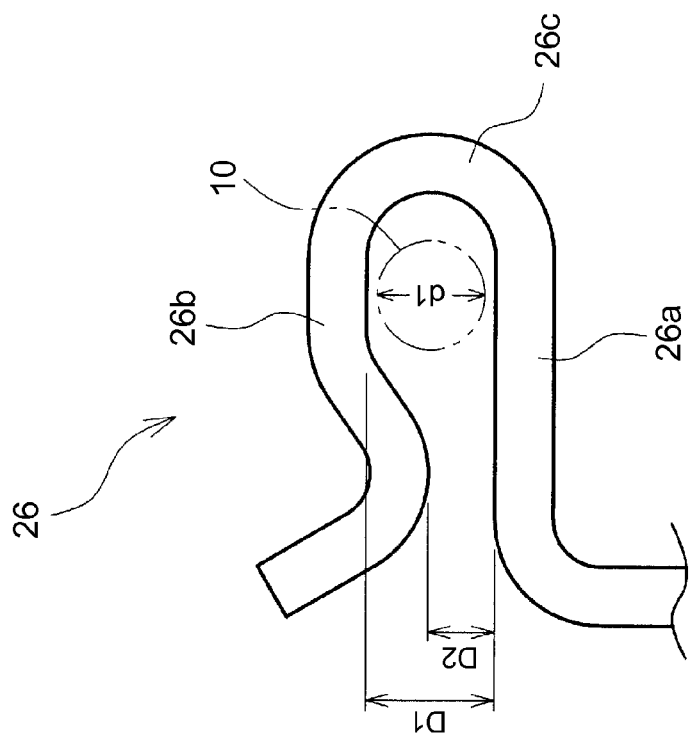
FIG. 3B is an enlarged view of a retention portion.
Figure 3A:
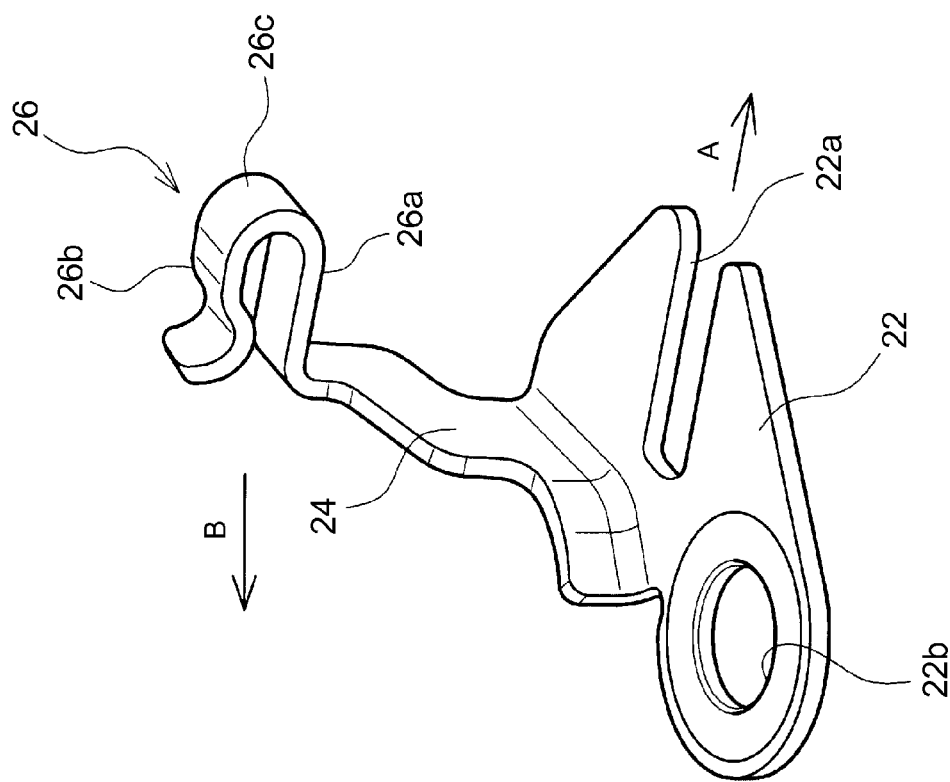
FIG. 3A is a perspective view of a bracket.

In the present embodiment of the invention, the wire harness 10 is fixed through the use of the bracket 20 with a specific shape. FIG. 3A is a perspective view of the bracket 20. FIG. 3B is an enlarged view of a retention portion 26. The bracket 20 is a clasp made of a high-rigidity material such as iron, and is formed by bending a single metal plate (i.e., the bracket 20 is formed of a single metal plate that is bent). The bracket 20 includes a fastened portion 22 that is fastened to the cooling medium tank 16, the retention portion 26 that retains the wire harness 10, and a connecting portion 24 that connects the fastened portion 22 to the retention portion 26. The fastened portion 22 is in the form of a flat plate, and is disposed on the surface of the cooling medium tank 16. A bolt hole 22b through which a fastening bolt 28 is inserted, and the engagement slit 22a are formed in the fastened portion 22. The intermediate portion 12b of the temperature sensor 12 enters the engagement slit 22a. The engagement slit 22a extends from one end edge of the fastened portion 22, and has a width that is larger than the diameter of the intermediate portion 12b and smaller than the diameter of the body portion 12a. The intermediate portion 12b is caused to enter the engagement slit 22a in a sliding manner, and thus, the fastened portion 22 and the temperature sensor 12 are engaged with each other. Accordingly, the engagement slit 22a functions as an engagement portion that engages with a portion of the temperature sensor 12.

The connecting portion 24 extends upward from the other end edge of the fastened portion 22 (the edge on the side opposite to the edge where the engagement slit 22a is formed). The retention portion 26 is connected with a distal end of the connecting portion 24. The retention portion 26 is a portion that retains the wire harness 10 to regulate the route thereof such that the wire harness 10 extends through the desired wiring route. The retention portion 26 retains the wire harness 10 at a location in the desired wiring route, the location being close to (in the vicinity of) the cooling medium relief valves 18. In particular, with regard to the height position, the height position of the retention portion 26 is substantially the same as the height position of the cooling medium relief valves 18.

The retention portion 26 has a substantially U-shaped form that is closed at a side facing the cooling medium relief valves 18 (i.e., a cooling-medium relief valves 18-side), and is open at a side opposite to the cooling-medium relief valves 18-side. In other words, a portion of the retention portion 26 that faces the cooling medium relief valves 18 (i.e., a cooling medium relief valves 18-side portion of the retention portion 26) is closed, and a portion of the retention portion 26 that is opposite to the cooling medium relief valves 18-side is open. More specifically, the retention portion 26 is divided into a horizontal portion 26a that extends in a horizontal direction and toward the cooling medium relief valves 18 from the distal end of the connecting portion 24, a spring portion 26b that is located above the horizontal portion 26a, and an arc portion 26c that has a substantially arc shape and that connects the horizontal portion 26a to the spring portion 26b. A distance (an opening width) D1 between the horizontal portion 26a and the spring portion 26b is larger than a diameter d1 of the wire harness 10, and the wire harness 10 can be retained inside the U-shaped form of the retention portion 26. However, the spring portion 26b is undulated in a substantially S-shaped form, and the opening width is narrowed in the vicinity of an opening end of the U-shaped form, that is, an opening width D2 in the vicinity of the opening end of the U-shaped form is set so as to be smaller than the diameter d1 of the wire harness 10, as shown in FIG. 3B. By thus narrowing the opening width in the vicinity of the opening end, the wire harness 10 is effectively prevented from being inadvertently detached from the retention portion 26. The spring portion 26b has appropriate elasticity. The opening width can be appropriately changed by pressing the spring portion 26b upward. Thus, the wire harness 10 can be caused to enter the inside of the U-shaped form of the retention portion 26 from an area on the side of the retention portion 26 (on the left side in FIG. 3B).

As is apparent from FIG. 3A and the like, the U-shaped form of the retention portion 26 is open at the side opposite to the engagement slit 22a of the fastened portion 22. In this manner, the retention portion 26 and the fastened portion 22 are open at the sides opposite to each other, and are closed at the sides opposite to each other. Thus, when the bracket 20 receives a force in the horizontal direction, the movement of the bracket 20 in the horizontal direction is hindered, and therefore, the wire harness 10 and the temperature sensor 12 can be effectively prevented from being inadvertently detached from the bracket 20. That is, when the bracket 20 is about to move in an A direction upon receiving a force in the A direction, the fastened portion 22 interferes with the intermediate portion 12b of the temperature sensor 12, and therefore, the bracket 20 is prevented from moving in the A direction. Further, when the bracket 20 is about to move in a B direction upon receiving a force in the B direction, the retention portion 26 interferes with the wire harness 10, and therefore, the bracket 20 is prevented from moving in the B direction. Thus, as a result, movement of the bracket 20 in the horizontal direction is hindered, and therefore, the wire harness 10 and the temperature sensor 12 are effectively prevented from being detached from the bracket 20. As a matter of course, when the bracket 20 is normally fastened by the fastening bolt 28, the bracket 20 does not move in the horizontal direction. In general, however, the cooling medium tank 16 is often installed adjacent to a unit that greatly vibrates, such as a transaxle. The fastening bolt 28 may loosen upon receiving the vibrations. In this case, the bracket 20 may rotate on a horizontal plane around the fastening bolt 28. However, as described above, the retention portion 26 and the fastened portion 22 are open at the sides opposite to each other, and are closed at the sides opposite to each other. Thus, when the fastening bolt 28 loosens, the bracket 20 can be prevented from rotating on the horizontal plane, and consequently, the wire harness 10 and the temperature sensor 12 can be prevented from being inadvertently detached from the bracket 20.

Next, a procedure of fixing the wire harness 10 using the bracket 20 with the above-described configuration will be described. In the case where the wire harness 10 is fixed, first, the temperature sensor 12 and the wire harness 10 are fitted to the bracket 20. That is, at a stage prior to attachment of the temperature sensor 12 and the bracket 20 to the cooling medium tank 16, the intermediate portion 12b of the temperature sensor 12 is caused to enter the engagement slit 22a of the bracket 20 in a sliding manner. Further, in this state, the wire harness 10 extending from the temperature sensor 12 is caused to enter the inside of the U-shaped form of the retention portion 26. It should be noted herein that the retention portion 26 has a U-shaped form surrounding three sides of the wire harness 10, and that the fastened portion 22 is shaped so as to be capable of engaging with the portion of the temperature sensor 12, in the present embodiment of the invention. Therefore, even when the bracket 20 is not fastened to the cooling medium tank 16, the bracket 20 can be held in a state in which the bracket 20 retains the wire harness 10 and engages with the portion of the sensor 12.

After the temperature sensor 12 and the wire harness 10 are fitted to the bracket 20, the detection element of the temperature sensor 12 in the fitted state is inserted into the insertion hole of the cooling medium tank 16, and the temperature sensor 12 is installed in the cooling medium tank 16. At this time, the angle of the bracket 20 combined with the temperature sensor 12 is adjusted, and the bolt hole 22b of the bracket 20 is aligned with a threaded screw hole that is formed in the cooling medium tank 16. Then, the fastening bolt 28 is screwed into the threaded screw hole, and the bracket 20 is fastened to the surface of the cooling medium tank 16.

In this state, the wire harness 10 is restrained by the retention portion 26 of the bracket 20 so as to extend through the desired wiring route, namely, a route that laterally bypasses the cooling medium relief valves 18 (i.e., extends through an area on the side of the cooling medium relief valves 18) and that is spaced apart from the cooling medium relief valves 18 by a certain distance or more. In particular, the retention portion 26 in the present embodiment of the invention has the substantially U-shaped form that is closed at the cooling medium relief valves 18-side. Therefore, the wire harness 10 retained by the retention portion 26 is effectively prevented from moving toward the cooling medium relief valves 18.

As described above, the retention portion 26 retains and restrains the wire harness 10 at a location in the desired wiring route, the location being close to (in the vicinity of) the cooling medium relief valves 18. By retaining and restraining the wire harness 10 at the location close to the cooling medium relief valves 18, the amount of looseness of the wire harness 10 in the vicinity of the cooling medium relief valves 18 decreases, and the wire harness 10 can be effectively prevented from interfering with the cooling medium relief valves 18. Accordingly, it is possible to effectively prevent problems such as damage to the wire harness 10 and deterioration of cooling performance.

Further, even when the bracket 20 is not fastened to the cooling medium tank 16, the bracket 20 in the present embodiment of the invention can be held in a state where the bracket 20 engages with the portion of the temperature sensor 12 and retains the wire harness 10. Therefore, at a stage prior to the fastening of the bracket 20 to the cooling medium tank 16, the temperature sensor 12 and the wire harness 10 can be fitted to the bracket 20. A working space that can be secured around the bracket 20 at a stage prior to the fastening of the bracket 20 to the cooling medium tank 16 is larger than that after the fastening. Thus, according to the present embodiment of the invention, the efficiency of the operation of fitting the temperature sensor 12 and the like can be increased, as compared to a case where the temperature sensor 12 and the like are fitted after the bracket 20 is fastened to the cooling medium tank 16.

Figure 5:
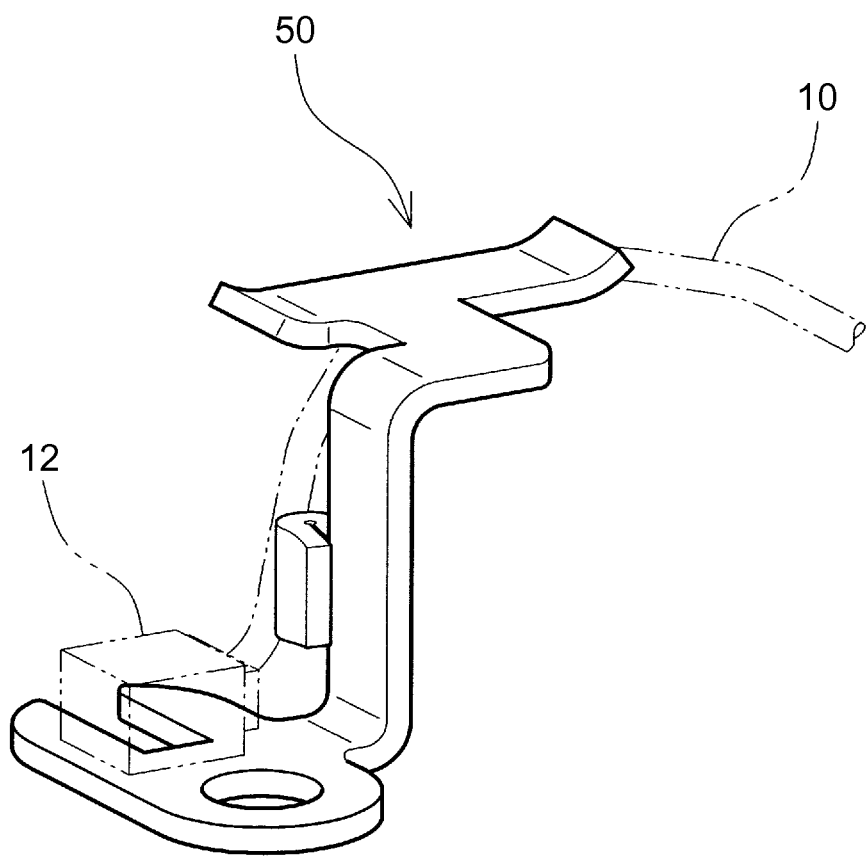
FIG. 5 is a perspective view of a bracket in related art.

The bracket 20 capable of regulating (defining) the route of the wire harness 10 in this manner has been conventionally proposed in the related art. FIG. 5 is a perspective view of the bracket 50 in the related art. However, as shown in FIG. 5, the bracket 50 in the related art is shaped so as to simply press down the wire harness 10 from above. Therefore, with the bracket 50 in the related art, the wire harness 10 can freely move in the horizontal direction, so the wire harness 10 relatively easily moves toward the cooling medium relief valves 18. As a result, the cooling medium injected from the cooling medium relief valves 18 may directly hit the wire harness 10.

The bracket 50 in the related art simply presses down the wire harness 10 from above, and does not "retain" the wire harness 10. Therefore, in the case of the bracket 50 in the related art, it is difficult to hold the wire harness 10 pressed down (it is difficult to maintain the wire harness 10 in the fitted state) when the bracket 50 is not fastened to the cooling medium tank 16. As a result, the operation of, for example, disposing the wire harness 10 at a position where the wire harness 10 can be pressed down by the bracket 50 (i.e., disposing the wire harness 10 in the desired wiring route) needs to be performed after the bracket 50 is fastened to the cooling medium tank 16. This leads to poor efficiency of the operation.

In contrast, as described above, the bracket 20 in the present embodiment of the invention effectively prevents the wire harness 10 from moving toward the cooling medium relief valves 18. Further, the temperature sensor 12 and the wire harness 10 are fitted to the bracket 20 before the bracket 20 is fastened to the cooling medium tank 16. Therefore, the efficiency of the operation of attaching the temperature sensor 12 and the wire harness 10 to the bracket 20 is increased as compared to the related art.

Figure 4A:
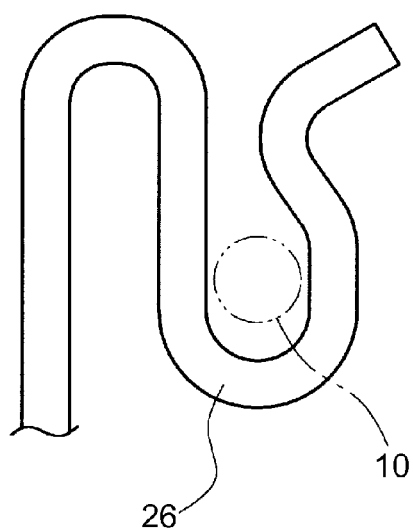
FIG. 4A and FIG. 4B are views each showing an example of another retention portion.
Figure 4B:
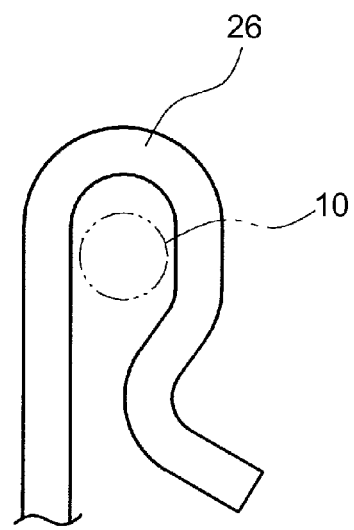

The configuration of the bracket 20 described above is an example. The bracket 20 may have configurations as long as the bracket 20 includes the fastened portion 22 that is fastened to the cooling medium tank 16, and the retention portion 26 that has a substantially U-shaped form closed at the side facing the cooling medium relief valves 18. For example, as long as the retention portion 26 is closed at the side facing the cooling medium relief valves 18, the retention portion 26 may have a U-shaped form that is open upward as shown in FIG. 4A or a U-shaped form that is open downward as shown in FIG. 4B.

Further, in the present embodiment of the invention, the wire harness fixing structure that is fitted to the cooling structure that cools the rotating electrical machine is exemplified. However, the art in the present embodiment of the invention may be applied to other cooling structures, for example, an engine cooling structure. Further, the sensor is not required to be a temperature sensor as long as it is attached to a cooling tank. Other sensors, for example, a liquid level sensor and a viscosity sensor may also be employed.

What is claimed is:

1. A wire harness fixing structure comprising:
   a cooling medium tank provided with a cooling medium relief valve;
   a sensor that is installed in the cooling medium tank;
   a connection terminal that is located beyond the cooling medium relief valve as viewed from a position where the sensor is installed;
   a wire harness that electrically connects the sensor to the connection terminal; and
   a bracket that is fastened to the cooling medium tank and that fixes the wire harness, the bracket including a fastened portion that is fastened to the cooling medium tank, and a retention portion that has a substantially U-shaped form closed at a side facing the cooling medium relief valve and that retains the wire harness in the U-shaped form.

2. The wire harness fixing structure according to claim 1, wherein the retention portion has the substantially U-shaped form that is open at a side opposite to the side facing the cooling medium relief valve.

3. The wire harness fixing structure according to claim 1, wherein the retention portion retains the wire harness at a location in a wiring route for the wire harness, the location being in vicinity of the cooling medium relief valve.

4. The wire harness fixing structure according to claim 1, wherein the fastened portion of the bracket has an engagement portion that engages with a portion of the sensor.

5. The wire harness fixing structure according to claim 4, wherein:
   the engagement portion is a slit that is formed in the fastened portion, and the portion of the sensor enters the slit; and
   the slit is open at a side opposite to an opening of the substantially U-shaped form of the retention portion.

6. The wire harness fixing structure according to claim 1, wherein:
   the bracket further includes a connecting portion that extends upward from an edge of the fastened portion to a point, and that extends diagonally upward from the point such that the connecting portion connects the fastened portion to the retention portion; and
   the fastened portion, the connecting portion, and the retention portion are formed of a single plate material that is bent.

* * * * *